United States Patent
Hoelzle

(10) Patent No.: US 7,773,452 B2
(45) Date of Patent: Aug. 10, 2010

(54) INTEGRATED LOGIC CIRCUIT AND METHOD FOR PRODUCING AN INTEGRATED LOGIC CIRCUIT

(75) Inventor: Josef Hoelzle, Woerishofen (DE)

(73) Assignee: Qimonda AG, Munich (DE)

( * ) Notice: Subject to any disclaimer, the term of this patent is extended or adjusted under 35 U.S.C. 154(b) by 97 days.

(21) Appl. No.: 12/142,910

(22) Filed: Jun. 20, 2008

(65) Prior Publication Data
US 2009/0022006 A1 Jan. 22, 2009

(30) Foreign Application Priority Data
Jun. 22, 2007 (DE) .................. 10 2007 028 802

(51) Int. Cl.
*G11C 8/00* (2006.01)
(52) U.S. Cl. ............... 365/230.06; 365/63; 365/230.08; 365/189.08
(58) Field of Classification Search ............ 365/230.06, 365/230.08, 189.08, 63
See application file for complete search history.

(56) References Cited

U.S. PATENT DOCUMENTS

| | | | | |
|---|---|---|---|---|
| 4,172,283 A | * | 10/1979 | Kober | 710/100 |
| 4,730,320 A | * | 3/1988 | Hidaka et al. | 714/766 |
| 4,903,268 A | * | 2/1990 | Hidaka et al. | 714/766 |
| 4,949,242 A | * | 8/1990 | Takeuchi et al. | 711/219 |
| 5,623,217 A | * | 4/1997 | Britton et al. | 326/40 |
| 5,668,771 A | * | 9/1997 | Cliff et al. | 365/230.03 |
| 5,801,547 A | * | 9/1998 | Kean | 326/40 |
| 5,930,502 A | * | 7/1999 | Picco et al. | 713/501 |
| 6,046,957 A | * | 4/2000 | Shyu | 365/230.06 |
| 6,073,233 A | * | 6/2000 | Chapman | 713/1 |
| 6,134,173 A | * | 10/2000 | Cliff et al. | 365/230.03 |
| 6,185,594 B1 | | 2/2001 | Hilton et al. | |
| 6,436,741 B2 | * | 8/2002 | Sato et al. | 438/149 |
| 6,765,408 B2 | * | 7/2004 | Cheng et al. | 326/41 |
| 7,376,801 B2 | * | 5/2008 | Moriyama et al. | 711/154 |
| 7,403,445 B2 | * | 7/2008 | Choi | 365/230.08 |

FOREIGN PATENT DOCUMENTS

| | | |
|---|---|---|
| DE | 69913582 | 10/2004 |
| EP | 0935339 | 8/1999 |

* cited by examiner

*Primary Examiner*—Viet Q Nguyen
(74) *Attorney, Agent, or Firm*—Patterson & Sheridan, L.L.P.

(57) ABSTRACT

An integrated logic circuit comprises a memory area, wherein the memory area comprises a plurality of groups of memory cells, each group of memory cells assigned an address. The memory area further comprises an address decoder having a plurality of address inputs for receiving an address and for selecting a group of memory cells to which the received address is assigned and a plurality of data outputs for outputting information stored in a group of memory cells which is selected by the address decoder. The integrated logic circuit further comprises a coupling device which couples at least one portion of the data outputs of the memory area to at least one portion of the address inputs of the address decoder.

15 Claims, 5 Drawing Sheets

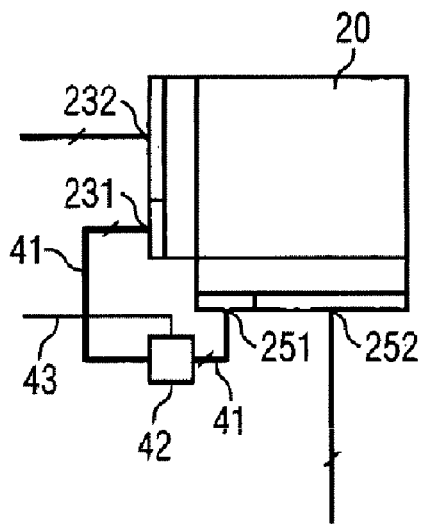
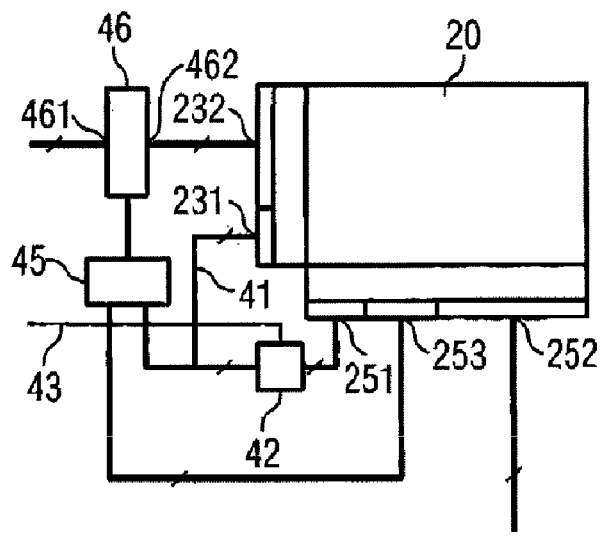
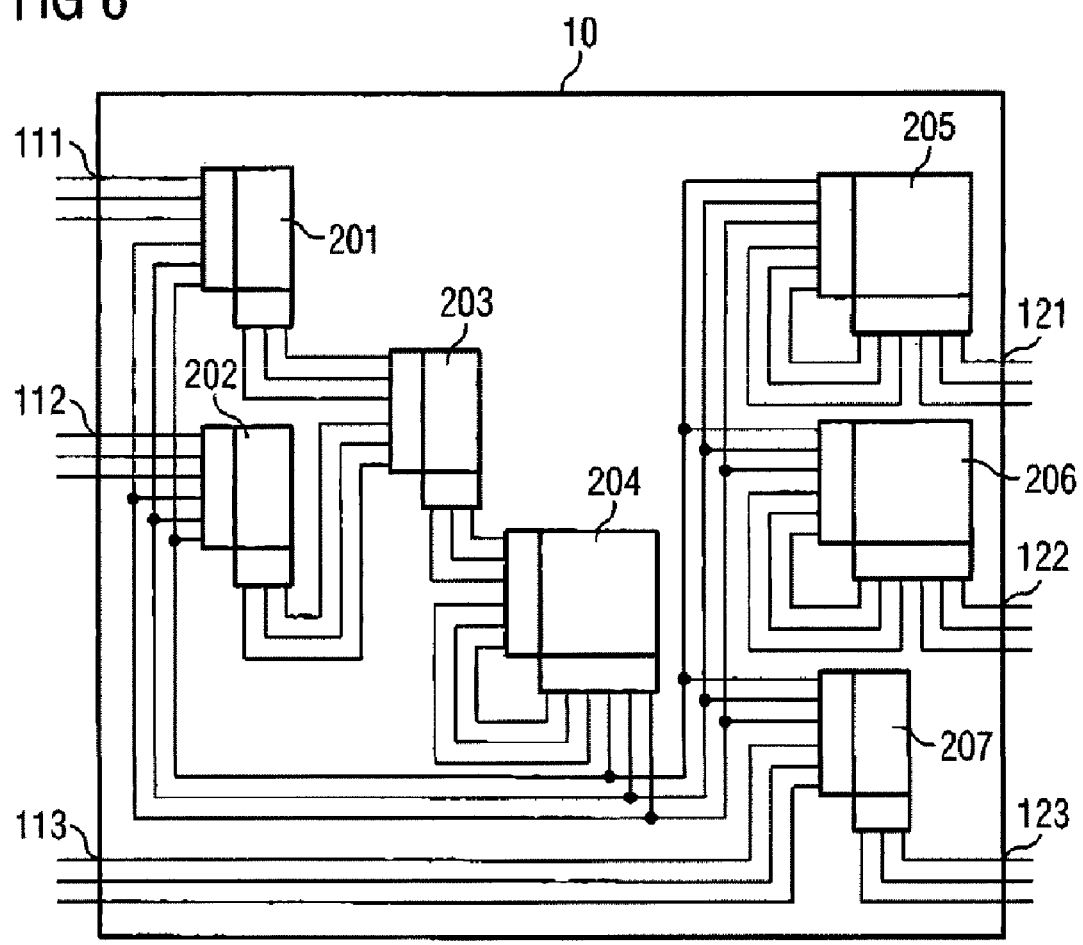

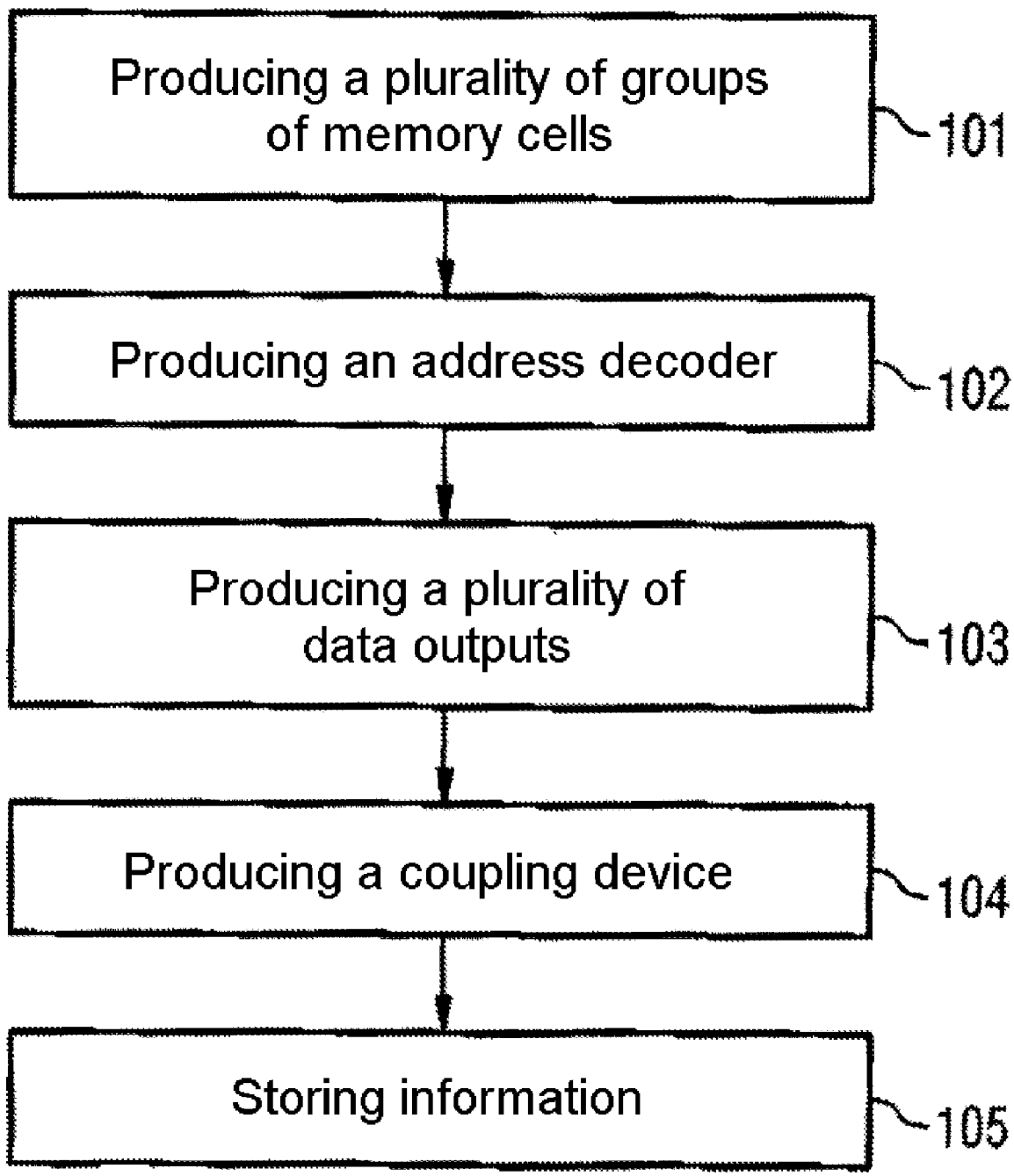

INTEGRATED LOGIC CIRCUIT AND METHOD FOR PRODUCING AN INTEGRATED LOGIC CIRCUIT

CROSS-REFERENCE TO RELATED APPLICATIONS

This application claims foreign priority benefits under 35 U.S.C. §119 to co-pending German patent application number DE 10 2007 028 802.8-55, filed 22 Jun. 2007. This related patent application is herein incorporated by reference in its entirety.

BACKGROUND

1. Field of the Invention

The present invention relates to an integrated logic circuit and a method for producing an integrated logic circuit.

2. Description of the Related Art

Logic circuits within the meaning of the present invention are circuits which convert items of information, condition them or process them in some other way. The information to be processed is generally received externally. The information is processed for example by logic combinations of received information items or of received information items with stored information items. The result of the information processing is output via outputs of the logic circuit.

Logic circuits are produced in great diversity and in large numbers and are being used in more and more areas of technology. Conventional logic circuits are for example FPGA components (FPGA=Field Programmable Gate Array), ASICs (ASIC=Application Specific Integrated Circuit), ASSP (ASSP=Application Specific Standard Product), Gate-Arrays, etc. These conventional logic circuits are generally combined with memory components on the same chip or on a separate chip. They are used inter alia for controlling or regulating numerous devices.

The logic circuit and the memory are generally manufactured using different technologies. Both the integration of a large memory with a logic circuit on one chip and the combination of two separate integrated circuits adversely affect the production costs.

BRIEF DESCRIPTION OF THE DRAWINGS

The above recited features of the present invention will become clear from the following description taking in conjunction with the accompanying drawings in which like reference numerals identify like elements. It is to be noted however, that the accompanying drawings illustrate only typical embodiments of the present invention and are therefore not to be considered limiting of the scope of the invention. The present invention may admit other equally effective embodiments. The present invention will be described below in more details with reference to the embodiments and drawings.

FIG. 4 shows a schematic illustration of part of an integrated logic circuit, according to one embodiment of the invention.

FIG. 5 shows a schematic illustration of part of an integrated logic circuit, according to one embodiment of the invention.

FIG. 6 shows a schematic illustration of an integrated logic circuit, according to one embodiment of the invention.

FIG. 12 shows a schematic illustration of a flow chart of a method for producing an integrated logic circuit, according to one embodiment of the invention.

DETAILED DESCRIPTION

Figure 1:
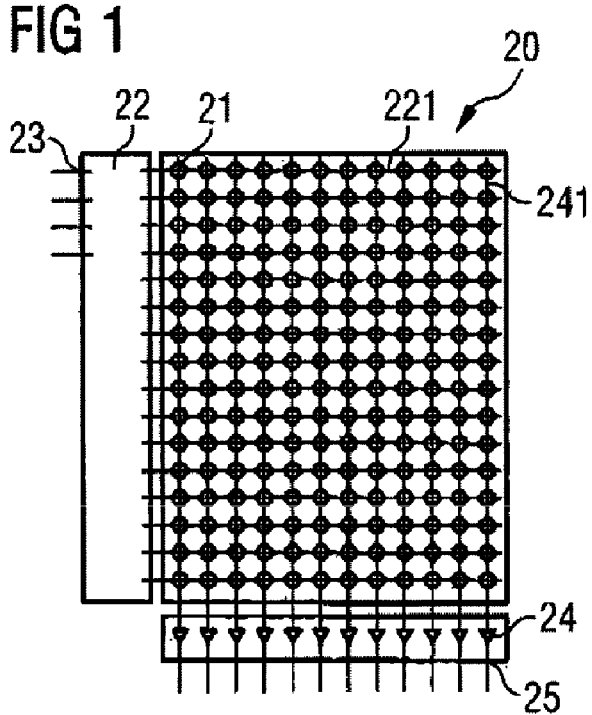
FIG. 1 shows a schematic illustration of a memory area, according to one embodiment of the invention.

One aspect is an integrated logic circuit comprising a memory area, wherein the memory area comprises a plurality of groups of memory cells, each group of memory cells assigned an address. The memory area further comprises an address decoder having a plurality of address inputs for receiving an address and for selecting a group of memory cells to which the received address is assigned and a plurality of data outputs for outputting information stored in a group of memory cells which is selected by the address decoder. The integrated logic circuit further comprises a coupling device which couples at least one portion of the data outputs of the memory area to at least one portion of the address inputs of the address decoder.

Another aspect is an integrated component comprising a plurality of memory areas, wherein each memory area comprises a plurality of groups of memory cells which are each assigned an address, an address decoder having a plurality of address inputs for receiving an address in order to select a group of memory cells to which the received address is assigned, and a plurality of data outputs for outputting information stored in a group of memory cells which is selected by the address decoder. The integrated component further comprises a coupling device which couples a first group of the data outputs of at least one first memory area to a first group of the address inputs of the address decoder of any of the at least one first memory area and of at least one further second memory area, wherein memory cells of any of the first memory area and of the further second memory area contain data which define a logic implemented in the component.

Another aspect is a method for producing an integrated logic circuit, comprising: producing a plurality of groups of memory cells, producing an address decoder having a plurality of address inputs for receiving an address and for selecting a group of memory cells to which the received address is assigned, producing a plurality of data outputs for outputting information stored in a group of memory cells which is selected by the address decoder and producing a coupling device which couples at least one portion of the data outputs of the memory area to at least one portion of the address inputs of the address decoder.

Another aspect is a method for implementing a logic on an integrated component comprising a plurality of memory areas, wherein each memory area comprises a plurality of groups of memory cells which are in each case assigned an address, an address decoder having a plurality of address inputs for receiving an address in order to select a group of memory cells to which the received address is assigned and a plurality of data outputs for outputting information stored in a group of memory cells which is selected by the address decoder. A first group of the data outputs of at least one first memory area is coupled to a first group of the address inputs of the address decoder of any of the at least one first memory area and of at least one further second memory area, wherein data which define a logic implemented in the component are stored in memory cells of any of the first memory area and of the further second memory area.

FIG. 1 is a schematic illustration of an example of a memory area 20 which can be used for the logic circuits described below, according to one embodiment of the invention. The memory area 20 may have a plurality of memory cells 21 which can in each case assume two or more different states for storing one or a plurality of bits in each case. Each memory cell 21 may be for example a DRAM or some other volatile memory cell or a ROM, PROM, EPROM, EEPROM, MRAM, PCRAM, CBRAM, flash or other non-volatile memory cell. The memory cells 21 may be arranged, as illustrated in FIG. 1, for example, in a rectangular array at crossover points of word lines 221 and bit lines 241.

The word lines 221 may be connected to an address decoder 22. The address decoder 22 may have a plurality of address inputs 23. The bit lines 241 may be connected to sense amplifiers 24. The sense amplifiers 24 may have data outputs 25. As an alternative to the illustration in FIG. 1, by way of example, memory cells 21 can be arranged only at every second crossover of a word line 221 with a bit line 241 and each sense amplifier 24 can be connected to two bit lines 241.

In the example illustrated in FIG. 1, the address decoder 22 has four address inputs 23. In this case, if the address decoder 22 is designed to receive a binary signal via each address input 23, it can receive up to 16 different addresses and individually address a corresponding number of word lines 221. If the memory area 20, as illustrated by way of example in FIG. 1, comprises 12 sense amplifiers 24, the memory area 20 can comprise up to 192 memory cells 21 arranged in 16 groups of 12 memory cells 21.

Figure 2:
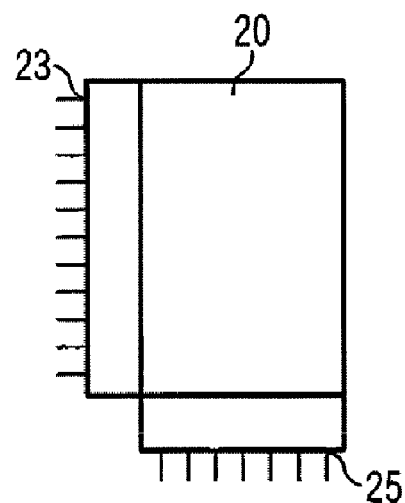
FIG. 2 shows a schematic illustration of a memory area, according to one embodiment of the invention.

FIG. 2 is a schematic illustration of a memory area 20 in the manner of how memory areas are schematically illustrated in the subsequent Figures, according to one embodiment of the invention. Irrespective of the internal construction, in particular the number and type of memory cells, the number of word lines, the number of bit lines, the number of sense amplifiers, the number of address inputs and the number of bits stored in a memory cell, a memory area 20 in each case comprises a plurality of groups of memory cells which are in each case assigned an address. The term memory cell here encompasses any type of more or less sharply delimitable memory location. A memory cell can be realized by electrical or electronic components or else by optical or other components or more or less defined locations in any desired memory medium. The memory area 20 can receive an address via address inputs 23 and output, via data outputs 25, information stored in the group of memory cells to which the address is assigned.

Figure 3:
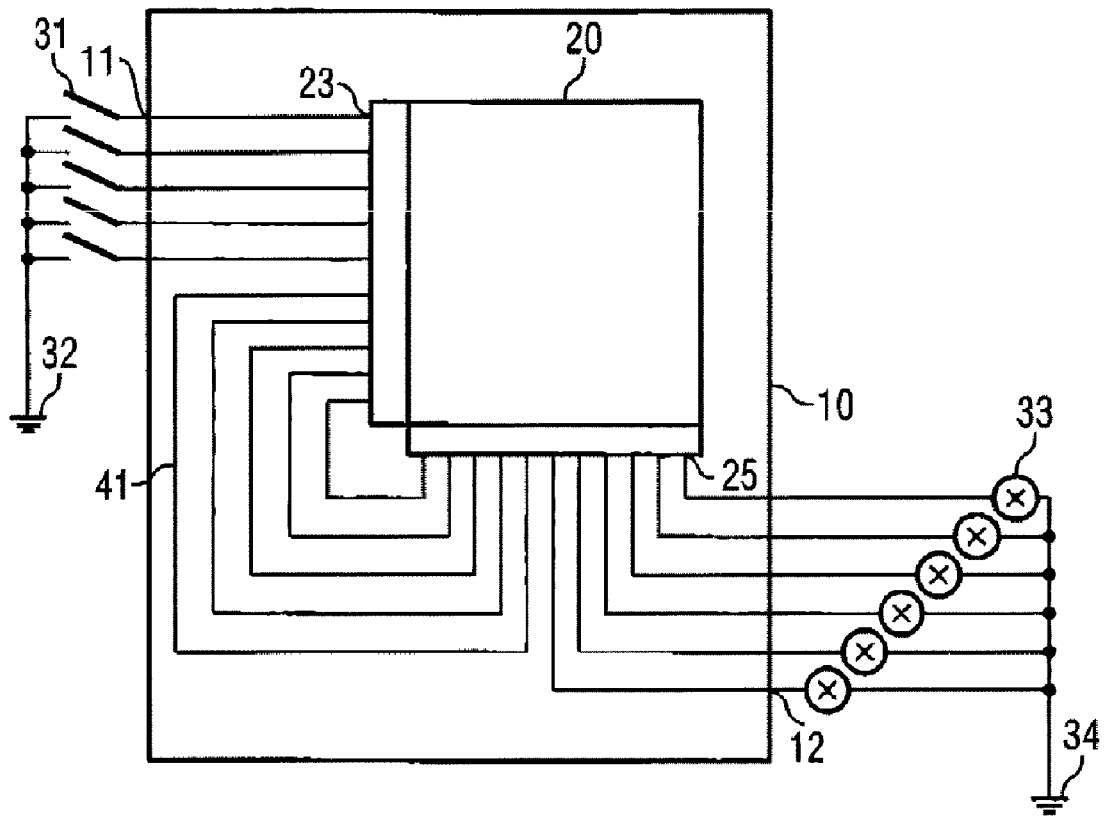
FIG. 3 shows a schematic illustration of an integrated logic circuit with further elements, according to one embodiment of the invention.

FIG. 3 is a schematic illustration of an integrated logic circuit 10 having inputs 11 and outputs 12, according to one embodiment of the invention. Each input 11 of the integrated logic circuit 10 may be coupled to an address input 23 of a memory area 20. Each output 12 of the integrated logic circuit 10 may be coupled to a data output 25 of the memory area 20. The number of address inputs 23 of the memory area 20 may be greater than the number of inputs 11 of the integrated logic circuit 10. The number of data outputs 25 of the memory area 20 may be greater than the number of outputs 12 of the integrated logic circuit 10. Address inputs 23 of the memory area 20 which are not coupled to inputs 11 of the integrated logic circuit 10 may be coupled to data outputs 25 of the memory area 20 via coupling lines 41.

In the example illustrated in FIG. 3, only data outputs 25 which are not coupled to outputs 12 of the integrated circuit 10 are coupled to address inputs 23 of the memory area 20. As an alternative, however, one or a plurality of data outputs 25 of the memory area 20 can also in each case simultaneously be coupled to an output 12 of the integrated logic circuit 10 and an address input 23 of the memory area 20. Furthermore, further address inputs (not illustrated in FIG. 3) of the memory area 20 can be coupled to further elements (not illustrated in FIG. 3). Furthermore, data outputs 25 illustrated in FIG. 3 and/or further data outputs (not illustrated in FIG. 3) of the memory area 20 can be coupled to further elements (not illustrated in FIG. 3).

Each input 11 of the integrated logic circuit 10 may be connected to ground 32 or some other defined potential via a switch 31. Each output 12 of the integrated logic circuit 10 may be connected to ground 34 or some other defined potential via an output device 33. The output devices 33 are illustrated as luminaires by way of example in FIG. 3. However, each individual output device 33 can be any desired acoustic indication device (buzzer, loudspeaker, etc.) or optical indication device (lamp, alphanumeric display, etc.) or electromechanical active device (electromagnet, relay, electromagnetic or piezoelectric valve, electric motor, etc.). In this case, as shown in FIG. 3, each individual output device 33 can be connected or coupled to an output 12 of the integrated logic circuit 10 directly via a line or in some other way (for example via an impedance converter or amplifier).

The switches 31 may be provided for example for being actuated by a user. The output devices 33 may be provided for example for indicating to the user a status for requesting said user to input an item of information or to make a selection. By way of example, the integrated logic circuit 10 may be part of an automatic ticket machine in local public transport. The switches 31 may be pushbuttons by means of which a passenger specifies a ticket, a destination or a desired method of payment, or with the aid of which the automatic ticket machine detects the insertion of a coin. The output devices 33 may be for example luminaires or multisegment displays which display the selected ticket, the fare, the remaining amount still to be inserted, or a malfunction, or an electric motor that moves a ticket to an issuing shaft in the automatic ticket machine.

In one embodiment, because one portion of the address inputs 23 of the memory area 20 are coupled to inputs of the integrated circuit 10 and another portion of the address inputs 23 are coupled to data outputs 25 of the memory area 20, the address received by the memory area 20 and the information output via the data outputs 25 may be dependent both on signals from the outside and on the information output last. The information output from the memory area 20 to the outputs 12 of the integrated logic circuit 10 and the actions or effects of the output devices 33 may therefore be dependent both on inputs at the inputs 11 of the integrated logic circuit 10 and on an internal state of the integrated logic circuit 10. This means a combination of an externally supplied item of information with an internal state.

FIG. 4 is a schematic illustration of part of an integrated logic circuit, according to one embodiment of the invention. In contrast to FIG. 3, inputs and outputs of the integrated logic circuit and the coupling thereof to address inputs or data outputs of a memory area 20 illustrated in FIG. 4 are not illustrated. The memory area 20 illustrated in FIG. 4 can be coupled to inputs and outputs of an integrated logic circuit for example in a manner corresponding to FIG. 3. However, the memory area 20 illustrated in FIG. 4 can also be part of a larger logic circuit comprising a plurality of memory areas, as is illustrated for example below with reference to FIGS. 6 to 11. In contrast to FIG. 3, moreover, the address inputs, data outputs and the lines connected thereto are no longer illustrated individually. The lines illustrated as broad lines in FIG. 4 each comprise any desired number of individual lines or communication channels via which information is transmitted in parallel or serially.

In contrast to the illustration in FIG. 3, in the memory area 20 illustrated in FIG. 4, a first group 251 of data outputs may be coupled to a first group 231 of address inputs of the memory area 20 not directly but via a clock synchronization device 42. The clock synchronization device 42 may receive a clock signal via a clock line 43. Said clock signal can be either an internal clock signal generated in the integrated logic circuit 10 or an internal clock signal derived from an external clock signal, or an externally supplied clock signal. The clock synchronization device 42 may bring about synchronization of the operation of the memory area 20 with the clock received via the clock line 43. The clock synchronization device 42 may simultaneously ensure that no undefined states of the data outputs pass to the address inputs. As an alternative, this may be ensured by devices at the address decoder or at the sense amplifiers of the memory area 20.

The clock synchronization device 42 may comprise for example a number of master-slave flip-flops corresponding to the number of individual lines or communication channels, the number of data outputs in the first group 251 of data outputs and the number of address inputs in the first group 231 of address inputs. In this case, by way of example, the input of each master-slave flip-flop may be coupled via an individual line to a data output from the first group 251 of data outputs, and the output of each master-slave flip-flop may coupled via an individual line to an address input from the first group 231 of address inputs.

FIG. 5 is a schematic illustration of part of a further integrated logic circuit, according to one embodiment of the invention. In a manner similar to the memory area illustrated above with reference to FIG. 4, a memory area 20 illustrated in FIG. 5 can be coupled to inputs and outputs of the integrated logic circuit in a manner corresponding to FIG. 3. As an alternative or in addition, the memory area 20 illustrated in FIG. 5 can be part of a larger integrated logic circuit having a plurality of memory areas. Such a larger integrated logic circuit is illustrated for example below with reference to FIGS. 6 to 11.

In a manner similar to the exemplary embodiment illustrated above with reference FIG. 4, a first group 231 of address inputs of the memory area 20 may be coupled to a first group 251 of data outputs of the memory area 20 via a coupling line 41 and a clock synchronization device 42. A second group 232 of address inputs may not be coupled to data outputs of the memory area 20. A second group 252 of data outputs of the memory area 20 may not be coupled to address inputs of the memory area 20.

In contrast to the exemplary embodiment illustrated above with reference to FIG. 4, a bus extension device 45 and a multiplexer 46 may be provided. A first input of the bus extension device 45 may be coupled to an output of the clock synchronization device 42 and thus receives the same information which the first group 231 of address inputs of the memory area 20 receives. A second input of the bus extension device 45 may coupled to a third group 253 of data outputs of the memory area 20. As an alternative to the illustration in FIG. 5, the second inputs of the bus extension device 45 can be coupled to the third group of data outputs 253 of the memory area 20 via a further clock synchronization device. An output of the bus extension device 45 may be connected to a control input of the multiplexer 46. An output 462 of the multiplexer 46 is coupled to the second group 232 of address inputs of the memory area 20.

The bus extension device 45 may combine information items output at the first group 251 and at the third group 253 of data outputs and controls the multiplexer 46. Depending on the information output at the first group 251 and at the third group 253 of data outputs, the multiplexer 46 may forward only a portion of the information which it receives via its input 461 to the second group 232 of address inputs of the memory area 20 via its output 462. By way of example, in specific internal states, specific user inputs received at the inputs 461 of the multiplexer 46 can be interpreted as incorrect operation and be rejected.

In the exemplary embodiment illustrated above with reference to FIG. 4, the first group 231 of address inputs may comprise six address inputs, the second group 232 of address inputs may comprise ten address inputs, the first group of data outputs 251 may comprise six data outputs and the second group 252 of data outputs may comprise ten data outputs. In this case, the memory area 20 then comprises $2^{16} \times 16$ bits=$2^{20}$ bits=1 Mbit.

By virtue of the use of the bus extension device 45 and the multiplexer 46 in the exemplary embodiment illustrated above with reference to FIG. 5, it may be possible to reduce the number of address inputs in the second group 232 of address inputs by comparison with the exemplary embodiment from FIG. 4 from 10 to 7. There are an additional two data outputs in the third group 253 of data outputs. The memory area 20 therefore comprises $2^{13} \times 18$ bits=144 kbits. The memory requirement can therefore be significantly reduced, under certain circumstances, by using the bus extension device 45 and the multiplexer 46.

In the simplest case, the bus extension device 45 may be a combination of the individual lines from the output of the clock synchronization device 42 and the individual lines from the third group 253 of data outputs of the memory area 20, which are then routed further in parallel to the control input of the multiplexer 46. The bus extension can be arranged at a distance from the control input of the multiplexer 46 or directly at the control input of the multiplexer 46 or be integrated with the control input of the multiplexer 46.

As an alternative, the bus extension device 45 may comprise a further multiplexer. It is thereby possible to reduce the number of individual lines between the bus extension device 45 and the control input of the multiplexer 46.

FIG. 6 is a schematic illustration of an integrated logic circuit 10 having a plurality of groups of inputs 111, 112, 113 and a plurality of groups of outputs 121, 122, 123, according to one embodiment of the invention. The integrated logic circuit 10 may comprise a plurality of memory areas 201, 202, 203, 204, 205, 206, 207 such as have been illustrated for example above with reference to FIG. 1. Each of the memory areas 201, ..., 207 may comprise a first group of address inputs and a second group of address inputs. A first group of inputs 111 of the integrated logic circuit 10 may be coupled to a second group of address inputs of the first memory area 201. A second group 112 of inputs of the integrated logic circuit 10 may be coupled to a second group of address inputs of a second memory area 202. Data outputs of the second memory area 202 may be coupled to a first group of address inputs of the third memory area 203. Data outputs of the first memory area 201 may be coupled to a second group of address inputs of the third memory area 203. Data outputs of the third memory area 203 may be coupled to a second group of address inputs of a fourth memory area 204. A first group of data outputs of the fourth memory area 204 may be coupled to a first group of address inputs of the fourth memory area 204. A second group of data outputs of the fourth memory area 204 may be coupled in parallel to a first group of address inputs of the first memory area 201, to a first group of address inputs of the second memory area 202, to a second group of address inputs of a fifth memory area 205, to a second group of address inputs of a sixth memory area 206 and to a second group of address inputs of a seventh memory area 207. A first group of data outputs of the fifth memory area 205 may be coupled to a first group of address inputs of the fifth memory area 205. A second group of data outputs of the fifth memory area 205 may be coupled to a first group 121 of outputs of the integrated logic circuit 10. A first group of data outputs of the sixth memory area 206 is coupled to a first group of address inputs of the sixth memory area 206. A second group of data outputs of the sixth memory area 206 may be coupled to a second group 122 of outputs of the integrated logic circuit 10. A first group of address inputs of the seventh memory area 207 may be coupled to a third group of inputs 113 of the integrated logic circuit 10. Data outputs of the seventh memory area 207 may be coupled to a third group 123 of outputs of the integrated logic circuit 10. Although in FIG. 6 each group of address inputs or data outputs is illustrated with three inputs or outputs, respectively, and is connected to three parallel lines in each case, the numbers of parallel lines and correspondingly the numbers of inputs and outputs connected to them can be as desired in each case.

FIG. 6 shows by way of example different types of possible couplings between a plurality of memory areas. The integrated logic circuit 10 illustrated in FIG. 6 can have further memory areas and further couplings between data outputs and address inputs of memory areas. Furthermore, the integrated logic circuit illustrated in FIG. 6 can also comprise further elements, for example clock synchronization devices or multiplexers, such as have been illustrated above with reference to FIGS. 4 and 5.

In the topology illustrated in FIG. 6, the first memory area 201, the second memory area 202 and the third memory area 203 may be provided for detection and conditioning of information received via the first group 111 and the second group 112 of inputs of the integrated logic circuit 10. The fourth memory area 204 may be assigned to the logic of the process sequence. The fifth memory area 205, the sixth memory area 206 and the seventh memory area 207 may be assigned to the outputting of information and the control of further elements and devices arranged outside the integrated logic circuit 10. By way of example, user inputs may be received via the first group 111 of inputs. For this purpose, the inputs of the first group 111 may be connected to switches or push buttons, for example. Furthermore, further information items for the control of a sequence may be received for example via the inputs of the second group 112. By way of example, the inputs of the second group 112 may be coupled to switches or other sensors which are actuated by coins inserted for payment.

The first memory area 201 may receive an item of information about an internal state via the first group of its address inputs from the second group of data outputs of the fourth memory area 204. In the example of an automatic ticket machine already mentioned, possible internal states are for example "before selection of a ticket" or "after selection of a ticket, before payment" or "after payment, before conclusion of the issuing of the ticket". Depending on these internal states, the first memory area 201 and the second memory area 202 may condition the information items received via the first group 111 and the second group 112. The conditioned information items may be transmitted to the third memory area 203 via the data outputs of the first memory area 201 and the second group of address inputs of the third memory area 203 and, respectively, via data outputs of the second memory area 202 and the first group of address inputs of the third memory area 203. The third memory 203 may condition these information items further and transmits them to the fourth memory area 204.

The fourth memory area 204 may control, via its second group of data outputs, the conditioning of information items received via the first group 111 and the second group 112 by the first memory area 201 and the second memory area 202, respectively, and the outputting of information items via the first group 121, the second group 122 and the third group 123 of outputs of the integrated logic circuit 10 by the fifth memory area 205, the sixth memory area 206 and the seventh memory area 207, respectively. In this case, by way of example, the fifth memory area 205 may contain optical indication information in the form of screen masks, the sixth memory area 206 may contain acoustic indication information in the form of sounds or a spoken announcement text, and the seventh memory area 207 may contain information for controlling output devices, for example for printing and issuing a ticket. For this purpose, the seventh memory area 207 for example may also receive and process information which it receives via the third group 113 of inputs at the integrated logic circuit 10 and the first group of its address inputs, for example the switching states of limit switches, light barriers, etc.

The integrated logic circuit 10 can be adapted diversely to a broad spectrum of tasks. By way of example, the number of groups 111, 112, 113 of inputs the number of inputs in each group 111, 112, 113, the number of memory areas 201, 202 directly coupled thereto, the number of steps in which the received information may be conditioned (in FIG. 6 via an intermediate step in the third memory 203), the number of groups 121, 122, 123 of outputs, the number of outputs in each group, the total number of memory areas 201, . . . , 207 and the size of each individual memory area can be adapted. By way of example, in a memory area that stores optical indication information, in some cases only a small number of screen masks may be stored, but each individual screen mask may comprise a very large volume of data. The memory area provided for this may have only a small address space and correspondingly few address inputs. However, a large number of memory cells may be assigned to each individual address. The same can correspondingly hold true for a memory area that is to contain a spoken announcement text, by way of example.

Figure 7:
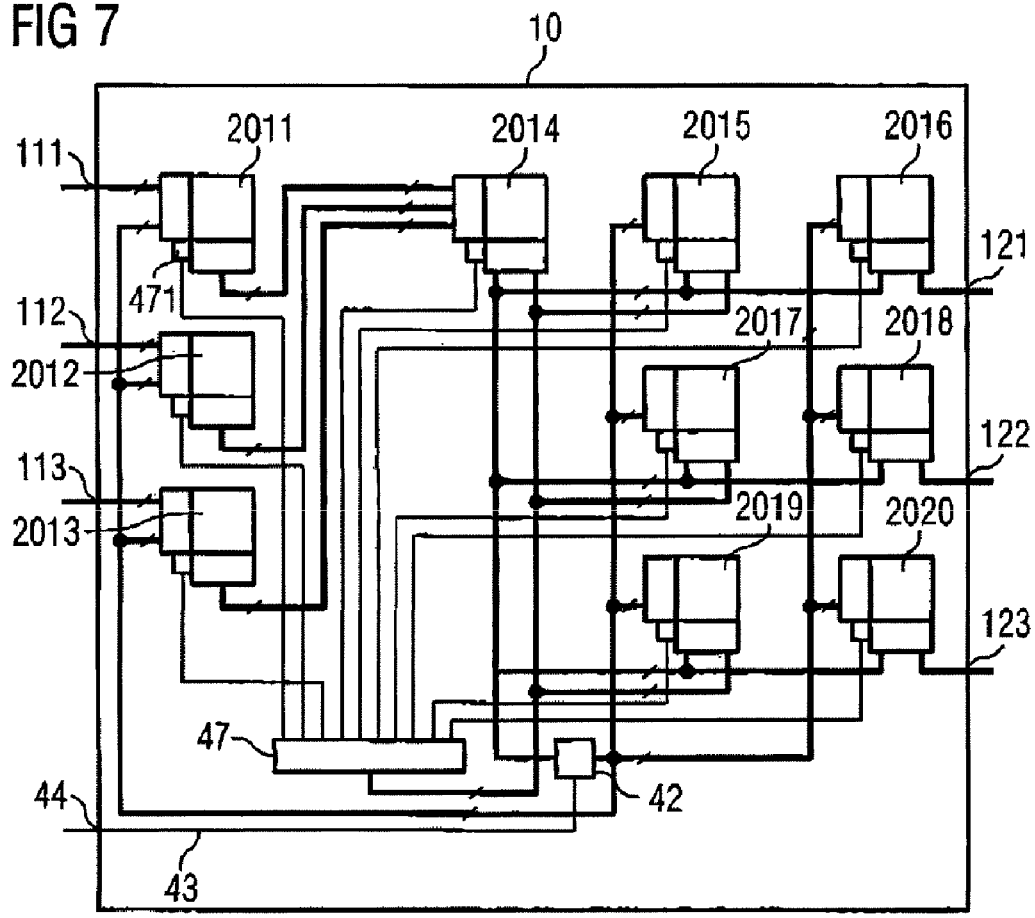
FIG. 7 shows a schematic illustration of an integrated logic circuit, according to one embodiment of the invention.

FIG. 7 is a schematic illustration of a further integrated logic circuit 10 having a plurality of groups 111, 112, 113 of inputs and a plurality of groups 121, 122, 123 of outputs, according to one embodiment of the invention. The integrated logic circuit 10 may comprise a plurality of memory areas 2011, 2012, 2013, 2014, 2015, 2016, 2017, 2018, 2019, 2020. The integrated logic circuit 10 furthermore may comprise a selecting device 47, which may be coupled via lines to selection receivers 471 at the memory areas 2011, . . . , 2020. The selection device 47 may be embodied for example like an address decoder of a memory area. The selection receiver may be provided with the reference symbol 471 only at the first memory area 2011, but a plurality or all of the memory areas may comprise corresponding selection receivers.

Furthermore, the integrated logic circuit 10 may comprise a clock synchronization device 42 similar to the clock synchronization device illustrated above with reference to FIGS. 4 and 5. The clock synchronization device 42 may be coupled to a clock input 44 of the integrated logic circuit 10 via a clock line 43. As an alternative, the clock synchronization device 42 may receive a clock signal from a clock signal source that is part of the integrated logic circuit 10. A first group of address inputs of the first memory area 2011, a first group of address inputs of a second memory area 2012, a first group of address inputs of a third memory area 2013 and address inputs of a fifth memory area 2015, of a sixth memory area 2016, of a seventh memory area 2017, of an eighth memory area 2018, of a ninth memory area 2019 and of a tenth memory area 2020 may be connected to an output of the clock synchronization device 42.

A second group of address inputs of the first memory area 2011 may be connected to a first group 111 of inputs of the integrated logic circuit 10. A second group of address inputs of the second memory area 2012 may be connected to a second group 112 of inputs of the integrated logic circuit 10. A second group of address inputs of the third memory 2013 may be connected to a third group 113 of inputs of the integrated logic circuit 10. Data outputs of the first memory area 2011, data outputs of the second memory area 2012 and data outputs of the third memory area 2013 may be connected to a first group and a second group and a third group, respectively, of address inputs of a forth memory area 2014. A first group of data outputs of the fourth memory area 2014, a first group of data outputs of the fifth memory area 2015, a first group of data outputs of the sixth memory area 2016, a first group of data outputs of the seventh memory area 2017, a first group of data outputs of the eighth memory area 2018, a first group of data outputs of the ninth memory area 2019 and a first group of data outputs of the tenth memory area 2020 may be connected to an input of the clock synchronization device 42. A second group of data outputs of the fourth memory area 2014, a second group of data outputs of the fifth memory area 2015, a second group of data outputs of the seventh memory area 2017 and a second group of data outputs of the ninth memory area 2019 may be connected to an input of the selection device 47. A second group of data outputs of the sixth memory area 2016 may be connected to the first group 121 with outputs of the integrated logic circuit 10. A second group of data outputs of the eighth memory area 2018 may be connected to a second group 122 of outputs of the integrated logic circuit 10. A second group of data outputs of the tenth memory area 2020 may be connected to a third group 123 of outputs of the integrated logic circuit 10.

In the integrated logic circuit illustrated above with reference to FIG. 6, the coupling between the data outputs of memory areas and address inputs of the same or other memory areas prescribes where an information item generated or altered by a memory area is transmitted to. In contrast to this, in the exemplary embodiment illustrated in FIG. 7, information provided by one of the memory areas 2014 to 2020 at the first group of data outputs thereof may be transmitted to all the memory areas 2011, 2012, 2013 and 2015 to 2020 via the clock synchronization device 42. In a manner controlled by the respective second group of data outputs of the fourth memory area 2014, of the fifth memory area 2015, of the seventh memory area 2017 and of the ninth memory area 2019, the selection device 47 may determine which of the memory areas 2014 to 2020 in the next clock cycle transmits information to the input of the clock synchronization device 42.

The information stored in a memory area does not only comprise the information which is output depending on the information received at the address inputs if the selection device 47 has selected the memory area. In the case of the fourth memory area 2014, the fifth memory area 2015, the seventh memory area 2017 and the ninth memory area 2019, the information items stored therein may also determine which memory area or which memory areas is or are selected by the selection device 47 in the respectively succeeding clock cycle. At each memory area the associated selection receiver 471 may ensure that the memory area outputs an information item at its data outputs only when the memory area is selected by the selection device 47. For this purpose, the selection receiver 471 may intervene for example in the power supply of the sense amplifiers or may isolate the outputs thereof from the data outputs of the memory area.

In one embodiment, in order to obtain defined signals at the input of the clock synchronization device 42, it may be expedient to select at any point in time only ever one memory area from the memory areas 2014 to 2020 whose respective first group of data outputs are connected in parallel to the input of the clock synchronization device 42. By contrast, a simultaneous selection of the first memory area 2011, of the second memory area 2012 and of the third memory area 2013, at the address inputs of the fourth memory area 2014, is also able to bring about no undefined signal levels if the data outputs of the first memory area 2011, of the second memory area 2012 and of the third memory area 2013 are coupled to different groups of address inputs of the fourth memory area 2014.

The described function of the selection device 47 and of the selection receivers 471 makes it possible to transmit an activity from one of the memory areas 2014, 2015, 2016, 2017, 2018, 2019, 2020 to another one of said memory areas. If one of the memory areas is active in a clock cycle and transmits an information item to the clock synchronization device 42, in the subsequent clock cycle the same memory area or another memory area can be activated in a manner controlled by a further information item, which may be transmitted from the active memory area to selection device 47. In this case, the activation of the same memory area is similar to the situations which are described above with reference to FIGS. 3, 4 and 5 and in which a portion of the data outputs of a memory area are connected to a portion of the address inputs of the same memory area.

In the exemplary embodiment illustrated with reference to FIG. 7, the first memory area 2011, the second memory area 2012, the third memory area 2013 and the fourth memory area 2014 may be provided for conditioning input signals received via the three groups 111, 112, 113 of inputs of the integrated logic circuit 10 in a first stage (comprising the first memory area 2011, the second memory area 2012 and the third memory area 2013), and a second stage (comprising the fourth memory area 2014, depending on an internal state of the integrated logic circuit 10. The fifth memory area 2015, the seventh memory area 2017 and the ninth memory area 2019 may be provided for a sequence control or a control of a process progression. The sixth memory area 2016, the eighth memory area 2018 and the tenth memory area 2020 may be provided for generating output signals at the three groups 121, 122, 123 of outputs of the integrated logic circuit 10. The fifth memory area 2015, the seventh memory area 2017 and the ninth memory area 2019 can contain for example the logic for different sub processes. The sixth memory area 2016, the eighth memory area 2018 and the tenth memory area 2020 may be provided for example for outputting information or signals to different receivers. By way of example, an optical indication unit or a driver circuit for an optical indication unit may be connected to the first group 121 of outputs of the integrated logic circuit 10, an acoustic indication device may be connected to the second group 122 of outputs, and a printing unit for producing and issuing a ticket or the like may be connected to the third group 123 of outputs.

The table below illustrates by way of example the content of a memory area such as can be used in a variant of the integrated logic circuit illustrated above with reference to FIG. 7. In contrast to the memory areas illustrated in FIG. 7, the memory area may comprise three groups of outputs. The first group may comprise two binary outputs and may be coupled to a selection device. The second group may comprise six binary outputs and may be coupled to the input of a clock synchronization device. The third group may comprise twelve binary outputs which may be coupled to a group of outputs of the integrated logic circuit. The third group of outputs may comprise two outputs which simultaneously may belong to the second group or which may be internally connected in parallel with two outputs of the second group. Furthermore, the memory area may comprise four binary inputs.

The left-hand column of the table specifies in each case the address of a group of memory cells (for example of a word line), and the right-hand column specifies in a binary representation the information stored in the corresponding group of memory cells. The first two bits counted from the left represent in each case an address (aa or bb) of a memory area that may be communicated to the selection device via the first group of outputs. The next four bits represent an address of a group of memory cells within a memory area which may be communicated to the input of the clock synchronization device via the second group of outputs. The last twelve bits ("xxxxxxxxxxxx" or "zzyyyyyy") represent an item of information which may be output via the third group of outputs. In this case, the seventh bit and the eighth bit may belong both to the second group and to the third group.

| Address of a group of memory cells | Information stored in the group of memory cells (binary) |
|---|---|
| 0 | aa0001xxxxxxxxxxxx |
| 1 | aa0010xxxxxxxxxxxx |
| 2 | aa0011xxxxxxxxxxxx |
| 3 | aa0100xxxxxxxxxxxx |
| 4 | aa0101xxxxxxxxxxxx |
| 5 | aa0110xxxxxxxxxxxx |
| 6 | aa0111xxxxxxxxxxxx |
| 7 | aa1000xxxxxxxxxxxx |
| 8 | aa1001xxxxxxxxxxxx |
| 9 | aa1010xxxxxxxxxxxx |
| 10 | aa1011xxxxxxxxxxxx |
| 11 | aa1100xxxxxxxxxxxx |
| 12 | aa1101xxxxxxxxxxxx |
| 13 | aa1110xxxxxxxxxxxx |
| 14 | aa1111xxxxxxxxxxxx |
| 15 | bbzzzzzzyyyyyyyy |

In the example illustrated in the table, both the first two bits contain the bits bb in the case of the fifteenth group of memory cells and the bits aa in all the other groups of memory cells. In this case the bits aa represent the address of the memory area whose content is represented in the table, and the bits bb represent the address of another memory area. The consequence of this is that after the calling-up of one of the addresses 0 to 14 within the memory area considered, the same memory area is selected again by the selection device.

After the address 15 has been called up, another memory area is selected by the selection device.

The next four bits (third bit to sixth bit) correspond in each case to the address of the next group of memory cells in the memory area. The content of the memory area of the respective first six bits of each group of memory cells as illustrated in the table therefore has the consequence that after the calling-up of any desired address between 0 and 14 in the memory area, the content of the addressed group and of the subsequent groups of memory cells is output via the third group of outputs and another memory area (having the address bb) is then selected.

The outputting of the seventh bit and of the eighth bit both via the second group of outputs and via the third group of outputs makes it possible to output addresses of different lengths. In the example illustrated on the basis of the table, the addresses within the memory area considered are only four bits long, while the address in the other memory area, which is addressed by "aa", is six bits long.

In the manner described, after the calling-up of a single address (0000) in a memory area (here having the address aa), large amounts of information can be output, which are greater than the amount of information that can be stored in a single group of memory cells in the memory area. Thus, by way of example, voice outputs and other sounds and also screen representations, etc. can be stored in one or a plurality of memory areas.

As an alternative, for storing large volumes of data, it is also possible to use a memory area which independently outputs the content of a plurality of groups of memory cells through automatic incrementing of the address.

Figure 8:
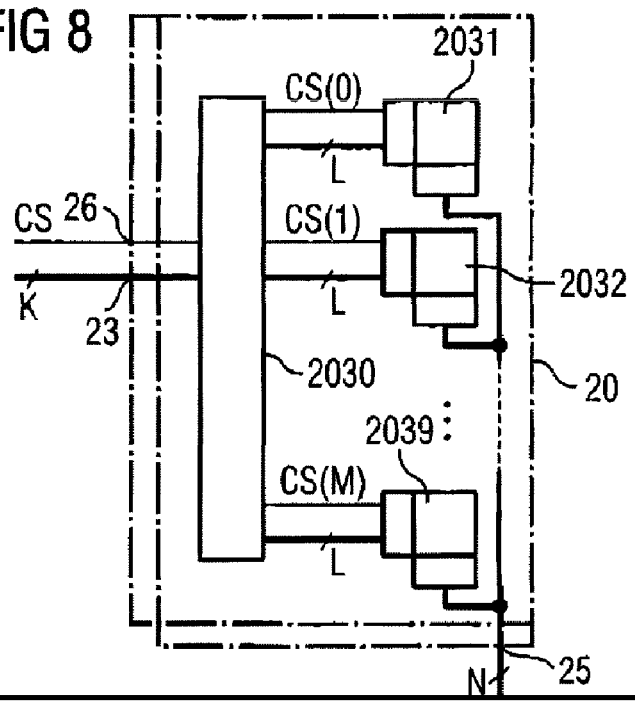
FIG. 8 shows a schematic illustration of part of an integrated logic circuit, according to one embodiment of the invention.

FIG. 8 is a schematic illustration of part of an integrated logic circuit, according to one embodiment of the invention. The integrated logic circuit may comprise a plurality of memory areas 2031, 2032, . . . , 2039 and a decoder 2030. Data outputs of the memory areas 2031, 2032, . . . , 2039 may be connected in parallel to N lines. An input of the decoder 2030 may be connected to K parallel lines. The decoder 2030 furthermore may have an address output for each of the memory areas 2031, 2032, . . . , 2039, said address output being connected via in each case L parallel lines to the address input of the corresponding memory area 2031, 2032, . . . , 2039. FIG. 8 furthermore illustrates a line via which the decoder 2030 receives a signal CS (for example a chip select signal). Furthermore, the decoder 2030 may be connected via a respective control line to each of the memory areas 2031, 2032, . . . , 2039 via which the signals CS(0), CS(1), . . . , CS(M) are transmitted. If the decoder 2030 receives an active control signal CS, it may output, depending on the address simultaneously received at its address input, an active control signal CS(0), CS(1), . . . , CS(M) to one of the memory areas 2031, 2032, . . . , 2039, the other control signals CS(0), CS(1), . . . , CS(M) being inactive.

The difference K−L between the number K of parallel lines to which the address input of the decoder 2030 is connected and the number L of parallel lines via which each memory area 2031, 2032, . . . , 2039 may be connected to the corresponding address output of the decoder 2030 is related to the number M+1 of memory areas 2031, 2032, . . . , 2039 such that $2^{K-L} \geq M+1$. If, by way of example, K=16 parallel lines are connected to the address input of the decoder 2030 and the address input of each memory area 2031, 2032, . . . , 2039 is connected to the corresponding address output of the decoder 2030 via L=12 parallel lines, the number M+1 of memory areas 2031, 2032, . . . , 2039 is a maximum of 16.

The decoder 2030 and the memory areas 2031, 2032, . . . , 2039 may act or behave outwardly together like a large memory area 20 having an address input 23 connected to K parallel lines, and having a data output 25 connected to N parallel lines. Consequently, FIG. 8 shows an example of how a larger memory area can be composed of a plurality of smaller memory areas.

In the case of the interconnection of the memory areas 2031, 2032, ..., 2039 with the decoder 2030 as illustrated in FIG. 8, the address space maybe increased. If a plurality of memory areas obtain or receive the same addresses, the width of the data output can be multiplied, on the other hand.

Figure 9:
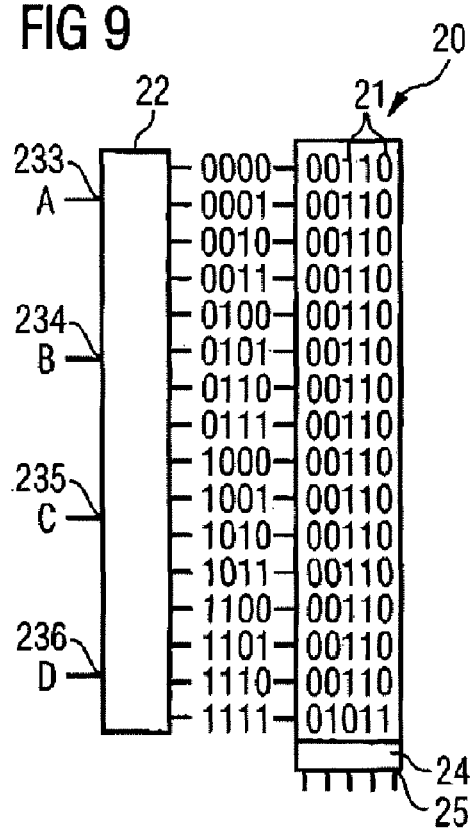
FIG. 9 shows a schematic illustration of part of an integrated logic circuit, according to one embodiment of the invention.

FIG. 9 is a schematic illustration of a memory area 20 of an integrated logic circuit, according to one embodiment of the invention. The memory area may have 80 memory cells 21, for example, which are arranged at all the crossovers of 16 word lines and 5 bit lines. Each memory cell 21 may be represented by a "0" or a "1", representing the value of the bit stored in the memory cell 21. The address decoder 22 may have four individual address inputs 233, 234, 235, 236 via which it receives the signals A, B, C, D. As shown, the addresses of the 16 word lines are represented in binary fashion between the address decoder 22 and the memory cells 21. In this case, each bit of the address corresponds to a signal A, B, C, D at one of the address inputs 233, 234, 235, 236 and each combination of the signals A, B, C, D (for example ABCD=0000, ABCD=0001, ABCD=0010 etc.) corresponds to an address. By way of example, the address decoder 22 activates the first word line if a non-active signal A, B, C, D or a "0" is present at all the inputs 233, 234, 235, 236 and the last word line, illustrated right at the bottom in FIG. 9, if a respective "1" is present at all the address inputs 233, 234, 235, 236.

In the example illustrated in FIG. 9, the memory area 20 outputs the data word "01011" via the data outputs 25 if a "1" is present at all the address inputs 233, 234, 235, 236. In all other cases, the memory area 20 outputs the data word "00110". It can be discerned that the information stored in the memory cells 21 of the memory area 20 thus has a high degree of redundancy.

Figure 10:
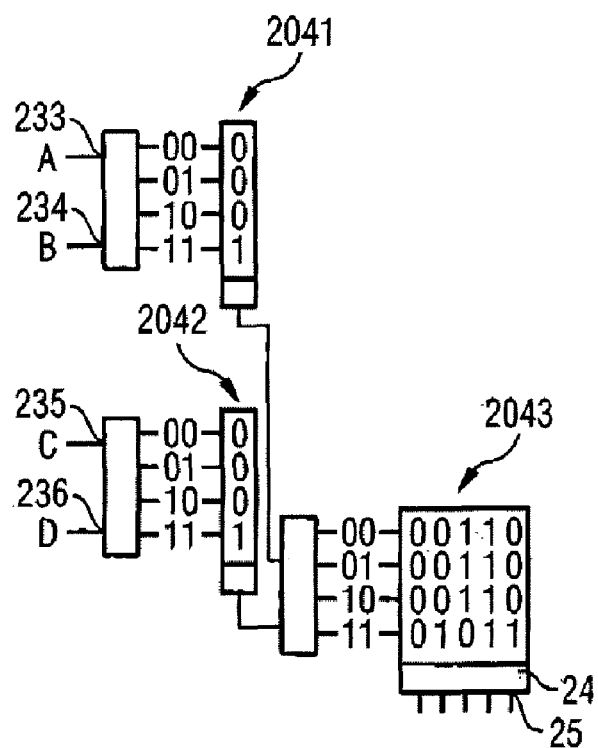
FIG. 10 shows a schematic illustration of part of an integrated logic circuit, according to one embodiment of the invention.

FIG. 10 shows an alternative exemplary embodiment to the exemplary embodiment from FIG. 9, in which the signals at four address inputs 233, 234, 235, 236 are logically combined in the same way as in FIG. 9. In particular, the data word "01011" may be output when a "1" is present at all four inputs 233, 234, 235, 236; in all other cases, the data word "00110" may be output.

In comparison with the exemplary embodiment illustrated above with reference to FIG. 9, the exemplary embodiment illustrated in FIG. 10 may comprise overall significantly fewer memory cells 21, which, however, are not arranged in a single memory area, but rather in a total of three memory areas 2041, 2042, 2043. The first memory area 2041 may have only two address inputs 233, 234 and four memory cells. A second memory area 2042 may have two address inputs 235, 236 and four memory cells. A third memory area 2043 may have two address inputs and 20 memory cells, which may be arranged for example on four word lines. The data output of the first memory area 2041 may be connected to a first address input of the third memory area 2043. The data output of the second memory area 2042 may be connected to a second address input of the third memory area 2043.

In all three memory areas 2041, 2042, 2043, in a manner similar to the illustration in FIG. 9, the memory cells are represented by the bits "0" and "1" stored in them. Furthermore, in a manner similar to FIG. 9, the addresses of the word lines are represented in binary fashion between the address decoders and the memory cells. It can be discerned that both the first memory area 2041 and the second memory area 2042 in each case generate a "1" at their data output when a "1" is present at in each case both address inputs 233 and 234, and 235 and 236, respectively. It can furthermore be discerned that the third memory area 2043 outputs the data word "01011" at its data outputs 25 if a "1" is present at both address inputs, and the data word "00110" in all other cases.

The exemplary embodiments illustrated with reference to FIGS. 9 and 10 are only examples with regard to the total number of memory cells, the number of word lines, the number of address inputs, the number of data outputs and with regard to the logic combination of the signals present at the address inputs. It is evident, however, that, at least under certain circumstances, logic combinations can be replaced either by a large memory area or by a plurality of smaller memory areas, wherein the total number of memory cells of the plurality of smaller memory areas can be less or significantly less than the total number of memory cells of the one large memory area.

The features and variants illustrated above with reference to FIGS. 1 to 10 can be very largely freely combined with one another. By way of example, clock synchronization devices 42 such as were illustrated above with reference to FIGS. 4, 5 and 7 can also be used in other exemplary embodiments illustrated above. Furthermore, by means of one or a plurality of selection devices such as were illustrated above with reference with FIG. 7, one or a plurality of memory areas or the outputs thereof can in each case be activated or deactivated in other exemplary embodiments as well. Furthermore, the combination of a plurality of memory areas to form one large memory area as illustrated above with reference to FIG. 8 can also be realized in other exemplary embodiments illustrated above. The alternative use of a large memory area or of a plurality of small memory areas for implementing a logic as illustrated above with reference to FIGS. 9 and 10 may also be possible for all the exemplary embodiments and variants thereof.

As already mentioned, the logic implemented by an integrated logic circuit illustrated above is contained partly in the wiring of one or a plurality of memory areas and partly in the information stored in the memory areas. A first specialization of an integrated logic circuit for a specific class or group of applications can be effected by the wiring of the memory areas within the integrated logic circuit. An integrated logic circuit can be adapted to a specific task by a definition of the information stored in the memory area or memory areas. Depending on the type of individual memory cells, this last step can also be effected after the integrated logic circuit has been completed. In the case of rewritable or multiply writable memory cells, an integrated logic circuit can be programmed successively for different tasks.

Figure 11:
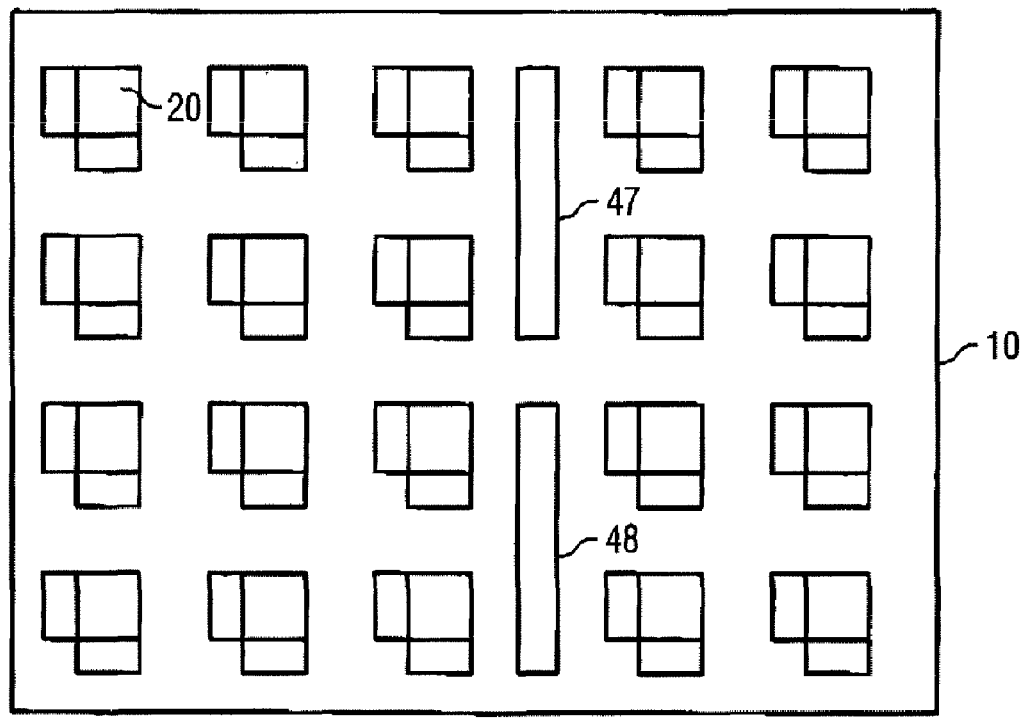
FIG. 11 shows a schematic illustration of an integrated logic circuit, according to one embodiment of the invention.

FIG. 11 is a schematic illustration of an integrated logic circuit 10 having a plurality of memory areas 20, one or a plurality of selection devices 47 and one or a plurality of decoders 48, according to one embodiment of the invention. The memory areas 20, the selection device or devices 47 and the decoder or decoders 48 may be produced for example by patterning a semiconductor surface. The production of the integrated logic circuit 10 without a wiring of the memory areas 20, of the selection devices 47 and of the decoders 48 without a wiring can be effected in large numbers and therefore comparatively cost-effectively. For a specialization of the integrated logic circuit for a specific type or class of applications, it is merely necessary to produce and use one or a plurality of special masks for the wiring level or the wiring levels. Depending on the type of memory cells used, the integrated logic circuit 10 can then be programmed in a simple manner, under certain circumstances, for its future task.

FIG. 12 is a schematic illustration of a flow chart of a method for producing an integrated logic circuit, according to one embodiment of the invention. A first step 101 may involve producing a plurality of groups of memory cells. A second step 102 may involve producing an address decoder having a plurality of address inputs for receiving an address and for selecting a group of memory cells. A third step 103 may involve producing a plurality of data outputs for outputting information. The third step 103 can comprise producing sense amplifiers. The first step 101, the second step 102 and the third step 103 can be performed in any desired order or else wholly or partly simultaneously. A plurality of memory areas each comprising a plurality of groups of memory cells, an address decoder and a plurality of data outputs can be produced simultaneously or successively by means of the first step 101, the second step 102 and the third step 103.

A fourth step 104 may involve producing a coupling device, which couples at least one portion of the data outputs of the memory area or of a first memory area to at least one portion of the address inputs of the address decoder of the memory area or of the first memory area or of a second memory area. The coupling device may comprise for example electrical or optical lines, a clock synchronization device, a multiplexer, one or a plurality of further memory areas or other devices. The fourth step 104 can be performed together with the first step 101, the second step 102 and the third step 103 or directly after these steps in a temporally continuous production method. As an alternative, the fourth step 104 may be performed at a later or significantly later point in time than the first step 101, the second step 102 and the third step 103.

A fifth step 105 may involve storing information in the memory cells which defines a logic to be implemented by the integrated logic circuit. The fifth step 105 too, can be performed together with or directly after the first step 101, the second step 102, the third step 103 and the fourth step 104 or temporally separately from them at a later point in time.

The integrated logic circuits illustrated above with reference to the figures are suitable for a broad spectrum of applications. Besides the automatic ticket machines already mentioned a number of times, further examples include, inter alia, user interfaces for office machines and other devices, and monitoring tasks. For various applications, it is also possible to store information during the running time in part of a memory area or in one or a plurality of memory areas provided for this. By way of example, images of monitoring cameras can be stored in a memory area of an integrated logic circuit and be compared with subsequent images in order to detect changes.

The present invention is based on the insight that numerous tasks for which logic circuits are used call for a large memory requirement for screen masks, acoustic announcements, etc., but only a relatively simple logic, for example exclusively branchings. A logic may be realized by means of one or a plurality of memory areas and the combination thereof in an integrated circuit. Data outputs of one memory area may be coupled directly or indirectly to address inputs of the memory area or of another memory area of the integrated circuit. The logic may be implemented by the coupling of the data outputs to the address inputs and by the information stored in the memory area.

The memory cells of the memory area can comprise both read only memory (ROM) memory cells and non-volatile or volatile memory cells having a variable content (DRAM, FRAM, MRAM, PCRAM, CBRAM, PROM, EPROM EEPROM, flash etc.). A memory area can comprise memory cells of a plurality of different types, or a plurality of memory areas can each comprise one of a plurality of types of memory cells. Memory cells having an invariable content are implemented for example by, in a DRAM circuit, the storage capacitors being replaced by electrically conductive connections (for example pull-up or pull-down resistors) $V_{DD}$ or $V_{SS}$. In this case, the logic is programmed for example in the back-end of the production line by means of conductive structures in a metallization level.

The use of PROM, EPROM, EEPROM, FRAM, MRAM, PCRAM, CBRAM, flash or other memory cells which can be written to once or multiply after the conclusion of the production method makes it possible for the integrated logic circuit to be programmed independently of its production. The integrated logic circuit can be produced, housed and stored in large numbers and hence cost-effectively. The adaptation to a specific task or the programming of the logic is possible at any time. In the case of multiply rewritable memory cells (EEPROM, EPROM, MRAM, PCRAM, CBRAM, flash etc.), the logic implemented on the integrated logic circuit by the memory content of the memory cells can be corrected, modified or adapted to a new task at any time.

A use of volatile memory cells (for example DRAM) results in the logic being erased after the power supply has been interrupted for more than just a short time. For the integrated logic circuit, a predetermined lifetime can be determined for example by the dimensioning of the energy stored in a capacitor or a rechargeable battery. Furthermore, by using volatile memory cells it can be ensured that, in the event of a device being manipulated, the implemented logic is erased, for example by interruption of the power supply.

An integrated logic circuit can comprise a plurality or large number of memory areas, wherein each memory area comprises a plurality of groups of memory cells, an address decoder and a plurality of data outputs. A group of memory cells comprises for example the memory cells assigned to a word line. In each memory area, each group of memory cells may be assigned an address. The address decoder of a memory area may receive an address via a plurality of address inputs and may select the group of memory cells to which the received address is assigned. The information stored in the group of memory cells which is selected by the address decoder may be output via the plurality of data outputs. At least one portion of the data outputs of a memory area may be coupled to at least one portion of the address inputs of the address decoder of the same memory area or of another memory area. In the simplest case, this coupling is effected by means of a corresponding number of parallel lines. As an alternative, only one data output and one address input are coupled to one another, information being transmitted serially between the data output and the address input. The coupling may be effected by means of electrically conductive connections, optical waveguides and/or other communication channels. For synchronization with a clock, a master-slave memory or some other clock synchronization device can be provided in these lines.

An integrated logic circuit can be produced firstly with a multiplicity of memory areas such as have been described above, and optionally with further functional elements, for example decoders or multiplexers. Alongside decoders which, as address decoders, are part of a memory area, the integrated logic circuit can have further decoders. Furthermore, the integrated logic circuit can have multiplexers as parts of memory areas or else as functional elements independent of memory areas. A specialization for a specific type or class of tasks is then effected by the wiring or connection of the memory areas and other elements by interconnects in the back-end of the production process. A programming for a selected task is effected by corresponding information being written to the memory cells.

The preceding description only describes advantageous exemplary embodiments of the invention. The features disclosed therein and the claims and the drawings can therefore be essential for the realization of the invention in its various embodiments both individually and in any combination.

While the foregoing is directed to embodiments of the present invention other and further embodiments of this invention may be devised without departing from the basic scope of the invention. The scope of the present invention being determined by the claims that follow.

What is claimed is:

1. An integrated logic circuit, comprising:
a plurality of outputs; and
a memory area, wherein the memory area comprises:
   a plurality of groups of memory cells, wherein each group of memory cells is assigned an address;
   an address decoder having a plurality of address inputs for receiving an address and for selecting a group of memory cells to which the received address is assigned; and
   a plurality of data outputs for outputting information stored in a group of memory cells which is selected by the address decoder,
wherein the integrated circuit further comprises a coupling device which couples at least one portion of the data outputs of the memory area to at least one portion of the address inputs of the address decoder, the at least one portion of the data outputs of the memory area comprising data outputs which are not coupled with the plurality of outputs of the integrated circuit.

2. The integrated logic circuit as claimed in claim 1, wherein at least one portion of the memory cells is any of static memory cells, dynamic memory cells, and other volatile memory cells.

3. The integrated logic circuit as claimed in claim 1, wherein at least one portion of the memory cells is any of ROM, PROM, EPROM, EEPROM, FRAM, MRAM, PCRAM, CBRAM, flash, another writable non-volatile memory cell and another non-writable non-volatile memory cell.

4. The integrated logic circuit as claimed in claim 1, wherein the coupling device comprises any of a latch circuit and a master-slave flip-flop.

5. The integrated logic circuit as claimed in claim 1, wherein an input of the integrated logic circuit is coupled to an address input of the address decoder.

6. An integrated component, comprising:
a plurality of memory areas, wherein each memory area comprises a plurality of groups of memory cells which are each assigned an address;
an address decoder having a plurality of address inputs for receiving an address in order to select a group of memory cells to which the received address is assigned;
a plurality of data outputs for outputting information stored in the group of memory cells which is selected by the address decoder; and
a coupling device which couples a first group of the data outputs of at least one first memory area to a first group of the address inputs of the address decoder of any of the at least one first memory area and of at least one second memory area, wherein memory cells of any of the first memory area and of the second memory area contain data which define a logic implemented in the component.

7. The integrated component as claimed in claim 6, wherein the coupling device has a clock synchronization device.

8. The integrated component as claimed in claim 7, wherein the clock synchronization device comprises a master-slave flip-flop.

9. The integrated component as claimed in claim 6, wherein a bus extension device and a multiplexer are provided, wherein the multiplexer is connected upstream of a second group of address inputs of the first memory area, wherein a first input of the bus extension device is coupled to an output of the clock synchronization device and a second input of the bus extension device is coupled to a second group of the data outputs of the memory area and wherein an output of the bus extension device is connected to a control input of the multiplexer.

10. The integrated component as claimed in claim 6, wherein at least one portion of the memory cells is any of a static memory cell, a dynamic memory cell and another volatile memory cell.

11. The integrated component as claimed in claim 6, wherein at least one portion of the memory cells is any of ROM, PROM, EPROM, EEPROM, FRAM, MRAM, PCRAM, CBRAM, flash, another writeable nonvolatile memory cell and another non-writeable nonvolatile memory cell.

12. A method for producing an integrated logic circuit, comprising:
producing a plurality of outputs;
producing a plurality of groups of memory cells;
producing an address decoder having a plurality of address inputs for receiving an address and for selecting a group of memory cells to which the received address is assigned;
producing a plurality of data outputs for outputting information stored in the group of memory cells which is selected by the address decoder; and
producing a coupling device which couples at least one portion of the data outputs of the memory area to at least one portion of the address inputs of the address decoder, the at least one portion of the data outputs of the memory area comprising data outputs which are not coupled with the plurality of outputs of the integrated circuit.

13. The method as claimed in claim 11, further comprising storing information in the group of memory cells which defines a logic to be implemented by the integrated logic circuit.

14. A method for implementing a logic on an integrated component, comprising:
providing a plurality of memory areas, wherein each memory area comprises a plurality of groups of memory cells which are in each case assigned an address;
providing an address decoder having a plurality of address inputs for receiving an address in order to select a group of memory cells to which the received address is assigned; and
providing a plurality of data outputs for outputting information stored in a group of memory cells which is selected by the address decoder, wherein a first group of the data outputs of at least one first memory area is coupled to a first group of the address inputs of the address decoder of any of the at least one first memory area and of at least one further second memory area, and wherein data which define a logic implemented in the component are stored in memory cells of any of the first memory area and of the further second memory area.

15. The method as claimed in claim 14, wherein the first memory area is operated synchronously with a predetermined clock.

* * * * *